United States Patent
Kabe et al.

(10) Patent No.: US 8,003,484 B2
(45) Date of Patent: Aug. 23, 2011

(54) METHOD FOR FORMING SILICON OXIDE FILM, PLASMA PROCESSING APPARATUS AND STORAGE MEDIUM

(75) Inventors: Yoshiro Kabe, Amagasaki (JP); Takashi Kobayashi, Amagasaki (JP); Toshihiko Shiozawa, Amagasaki (JP); Junichi Kitagawa, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 170 days.

(21) Appl. No.: 12/443,044

(22) PCT Filed: Sep. 28, 2007

(86) PCT No.: PCT/JP2007/069041
§ 371 (c)(1),
(2), (4) Date: Mar. 26, 2009

(87) PCT Pub. No.: WO2008/038787
PCT Pub. Date: Apr. 3, 2008

(65) Prior Publication Data
US 2010/0093185 A1    Apr. 15, 2010

(30) Foreign Application Priority Data
Sep. 29, 2006 (JP) .................... 2006-267742

(51) Int. Cl.
*H01L 21/76* (2006.01)
(52) U.S. Cl. ........................................ 438/409
(58) Field of Classification Search .................. None
See application file for complete search history.

(56) References Cited

U.S. PATENT DOCUMENTS

| | | | |
|---|---|---|---|
| 5,067,437 A * | 11/1991 | Watanabe et al. | 118/715 |
| 5,225,036 A * | 7/1993 | Watanabe et al. | 438/597 |
| 5,756,402 A * | 5/1998 | Jimbo et al. | 438/724 |
| 6,214,736 B1 * | 4/2001 | Rotondaro et al. | 438/705 |
| 2005/0136610 A1 | 6/2005 | Kitagawa et al. | |
| 2006/0003603 A1 | 1/2006 | Fukuchi | |
| 2007/0018231 A1 * | 1/2007 | Mitani et al. | 257/315 |
| 2009/0053903 A1 * | 2/2009 | Kobayashi et al. | 438/772 |

FOREIGN PATENT DOCUMENTS

| JP | 2006-019413 | 1/2006 |
|---|---|---|
| WO | 2004/008519 | 1/2004 |

OTHER PUBLICATIONS

International Search Report.
PCT Notification of Transmittal of Translation of the International Preliminary Examination Report (Form PCT/IB/338) dated Jan. 2004.
PCT International Preliminary Report on Patentability (Form PCT/IB/373) dated Jan. 2004.
PCT Written Opinion of the International Searching Authority (Form/ISA/237) dated Apr. 2005.

* cited by examiner

*Primary Examiner* — Charles D Garber
*Assistant Examiner* — Andre' C Stevenson
(74) *Attorney, Agent, or Firm* — Smith, Gambrell & Russell, LLP (57) ABSTRACT

The present invention provides a method for forming a silicon oxide film, which has excellent insulating properties and higher quality that can enhance a yield in manufacture of semiconductor devices, while keeping advantageous points in a plasma oxidation process. In this method, plasma is generated under a first process condition that a ratio of oxygen in a processing gas is 1% or less and pressure is within a range of 0.133 to 133 Pa, so as to form the silicon oxide film, by oxidizing silicon on a surface of an object to be processed including silicon as a main component, by using the plasma (first oxidation step). Following the first oxidation step, the plasma is generated under a second process condition that the ratio of oxygen in the processing gas is 20% or more and the pressure is within a range of 400 to 1333 Pa, so as to form an additional silicon oxide film, by further oxidizing the surface of the object to be processed, by using the plasma (second oxidation step).

21 Claims, 7 Drawing Sheets

METHOD FOR FORMING SILICON OXIDE FILM, PLASMA PROCESSING APPARATUS AND STORAGE MEDIUM

BACKGROUND OF THE INVENTION

1. Field of the Invention

The present invention relates to a method for forming a silicon oxide film, a plasma processing apparatus and a storage medium, and in particular relates to the method for forming the silicon oxide film, plasma processing apparatus and storage medium, each applicable to the case of forming the silicon oxide film used as an insulating film in a process for manufacturing, for example, various semiconductor devices or the like.

2. Background Art

In the process for manufacturing the various semiconductor devices, the silicon oxide film, such as $SiO_2$ or the like, which is used as the insulating film, such as a gate insulating film of, for example, a transistor, is formed. The method for forming such a silicon oxide film can be broadly divided into a thermal oxidation process employing an oxidation furnace and/or RTP (Rapid Thermal Process) apparatus and a plasma oxidation process employing a plasma processing apparatus. For instance, in a wet oxidation process using the oxidation furnace, which is one aspect of the heating process, a silicon substrate or substrates are first heated up to a temperature above 800° C., and then exposed to an oxidizing atmosphere in a WVG (Water Vapor Generator) apparatus adapted for generating steam ($H_2O$) by combusting hydrogen with oxygen. In this manner, the surface of each silicon substrate can be oxidized, thereby forming the silicon oxide film thereon.

Meanwhile, in the plasma oxidation process, a processing gas containing an argon gas and an oxygen gas is used, with an approximately 1% flow rate of oxygen. Specifically, this plasma oxidation process is performed by applying plasma, which has been generated in a chamber under pressure of 133.3 Pa while being excited by a microwave, to each silicon surface. As used herein, such plasma excited by the microwave will be referred to as "microwave excitation plasma." This process can facilitate control of film thickness and form the silicon oxide film having relatively high quality (see, e.g., Patent Document 1).

Patent Document 1: WO2004/008519

Recently, the thermal oxidation process has been considered as a method that can form the silicon oxide film with higher quality. However, this process should be performed at a considerably high temperature exceeding 800° C., thus being likely to increase thermal budget and have negative impact, such as deformation or warp, on each silicon substrate, due to thermal stress.

Meanwhile, the plasma oxidation process described in the above Patent Document 1 is performed at a relatively low temperature of approximately 400° C., thereby substantially avoiding such undesired increase of the thermal budget and warp of each substrate that may be caused by the above thermal oxidation process. In addition, due to the plasma process performed under the condition of approximately 1% flow rate of $O_2$ and 133.3 Pa processing pressure (for convenience, such a condition will be, hereinafter, referred to as a "lower-pressure and lower-oxygen-concentration condition"), a significantly high oxidation rate can be achieved.

However, in the silicon oxide film obtained by such a plasma oxidation process, the insulating properties may be considerably changed, depending on the conditions of the plasma oxidation process. Therefore, in the case of manufacturing devices, such as MOS capacitors and the like, each using the silicon oxide film formed by the plasma oxidation process, as the insulating film thereof, failure of initial pressure resistance may tend to occur, thus significantly lowering the yield.

SUMMARY OF THE INVENTION

Therefore, it is an object of the present invention to provide a new method for forming the silicon oxide film having excellent insulating properties and other film qualities that can substantially enhance the yield of the manufacture of the semiconductor devices, while keeping advantageous points of the plasma oxidation process performed under the aforementioned lower-pressure and lower-oxygen-concentration condition.

The present invention is a method for forming a silicon oxide film, comprising: a first oxidation step for generating plasma of a processing gas, under a first process condition that a ratio of oxygen in the processing gas is 1% or less and pressure is within a range of 0.133 to 133 Pa, in a processing chamber of a plasma processing apparatus, so as to form the silicon oxide film, by oxidizing silicon on a surface of an object to be processed including silicon as a main component, by using the plasma; and a second oxidation step, performed following the first oxidation step, for generating plasma of a processing gas, under a second process condition that the ratio of oxygen in the processing gas is 20% or more and pressure is within a range of 400 to 1333 Pa, so as to form an additional silicon oxide film, by further oxidizing the surface of the object to be processed, by using the plasma, thereby improving quality of the silicon oxide film.

In the method for forming the silicon oxide film, according to the present invention, the process time for the second oxidation step is within a range of 1 to 600 seconds.

In the method for forming the silicon oxide film, according to the present invention, a ratio of film thickness of the silicon oxide film formed in the second oxidation step, relative to the total film thickness of the silicon oxide film and the additional silicon oxide film formed through both of the first and second oxidation steps, is within a range of 0.1 to 5%.

In the method for forming the silicon oxide film, according to the present invention, the ratio of oxygen in the processing gas in the first oxidation step is within a range of 0.2 to 1%.

In the method for forming the silicon oxide film, according to the present invention, the ratio of oxygen in the processing gas in the second oxidation step is within a range of 20 to 50%.

In the method for forming the silicon oxide film, according to the present invention, the processing gas, in the first oxidation step, contains 0.1 to 10% of hydrogen.

In the method for forming the silicon oxide film, according to the present invention, the processing temperature is within a range of 200 to 800° C. in the first and second oxidation steps.

In the method for forming the silicon oxide film, according to the present invention, the plasma in the first and second oxidation steps is microwave excitation plasma generated from the processing gas, with a microwave introduced into the processing chamber from a planar antenna having a plurality of slots formed therein.

Alternatively, the present invention is a plasma processing apparatus, comprising: a processing chamber configured to be evacuated into a vacuum state and adapted for providing a desired process to an object to be processed including silicon as a main component; a processing gas supply unit adapted for supplying a processing gas into the processing chamber; a plasma supply source adapted for generating plasma of the processing gas in the processing chamber, so as to form a silicon oxide film by oxidizing silicon on a surface of the object to be processed; an exhaust apparatus adapted for controlling pressure in the processing chamber; and a control unit adapted for controlling the processing gas supply unit, plasma supply source and exhaust apparatus, respectively, wherein the control unit is configured to control the processing gas supply unit, plasma supply source and exhaust apparatus, respectively, thereby to perform: a first oxidation step for generating the plasma of the processing gas, under a first process condition that a ratio of oxygen in the processing gas is 1% or less and the pressure is within a range of 0.133 to 133 Pa, in the processing chamber, so as to form the silicon oxide film, by oxidizing the silicon on the surface of the object to be processed, by using the plasma; and a second oxidation step, performed following the first oxidation step, for generating plasma of the processing gas, under a second process condition that a ratio of oxygen in the processing gas is 20% or more and pressure is within a range of 400 to 1333 Pa, so as to form an additional silicon oxide film, by further oxidizing the surface of the object to be processed, by using the plasma, thereby improving quality of the silicon oxide film.

Alternatively, the present invention is a computer-readable storage medium for storing therein a computer program for driving a computer to execute a method for forming a silicon oxide film, wherein the method for forming the silicon oxide film comprises: a first oxidation step for generating plasma of a processing gas, under a first process condition that a ratio of oxygen in the processing gas is 1% or less and pressure is within a range of 0.133 to 133 Pa, in a processing chamber of a plasma processing apparatus, so as to form the silicon oxide film, by oxidizing silicon on a surface of an object to be processed including silicon as a main component, by using the plasma; and a second oxidation step, performed following the first oxidation step, for generating plasma of a processing gas, under a second process condition that a ratio of oxygen in the processing gas is 20% or more and pressure is within a range of 400 to 1333 Pa, so as to form an additional silicon oxide film, by further oxidizing the surface of the object to be processed, by using the plasma, thereby improving quality of the silicon oxide film.

According to the present invention, the first oxidation process for forming the silicon oxide film is performed under the first process condition that the ratio of oxygen in the processing gas is 1% or lower and the pressure is 133 pa or lower. Following such a first oxidation process, the second oxidation process for forming the additional silicon oxide film is performed under the second process condition (for convenience of description, this condition will be hereinafter referred to as a "higher-pressure and higher-oxygen-concentration condition") that the ratio of oxygen in the processing gas is 20% or higher and the pressure is within the range of from 400 to 1333 Pa. With provision of such first and second oxidation processes, the silicon oxide film significantly excellent in the insulating properties can be formed, while successfully keeping advantageous points of the plasma oxidation process performed under the first process condition, including a higher oxidation rate of the plasma oxidation process, formation of preferably rounded shoulder portions and bottom edges in a pattern, adequate control of surface orientation dependent properties in the formation of the silicon oxide film and the like.

Namely, with the plasma process performed under the higher-pressure and higher-oxygen-concentration condition in the second oxidation step, lower yield as seen in an initial pressure resistance test and relatively poor film quality that are disadvantageous points of the plasma oxidation process performed under the first process condition can be positively improved, thus providing a significantly excellent silicon oxide film with higher density and less defects of Si—O bonds.

Accordingly, desired electrical properties can be provided to the semiconductor device including such a silicon oxide film obtained by this invention, as the insulating film thereof.

BRIEF DESCRIPTION OF THE DRAWINGS

FIGS. 4(a) to 4(i) are schematic diagrams, respectively illustrating one example of application to device separation for STI.

DETAILED DESCRIPTION OF THE INVENTION

Examples

Hereinafter, one preferred embodiment of the present invention will be described, with reference to the drawings.

Figure 1:
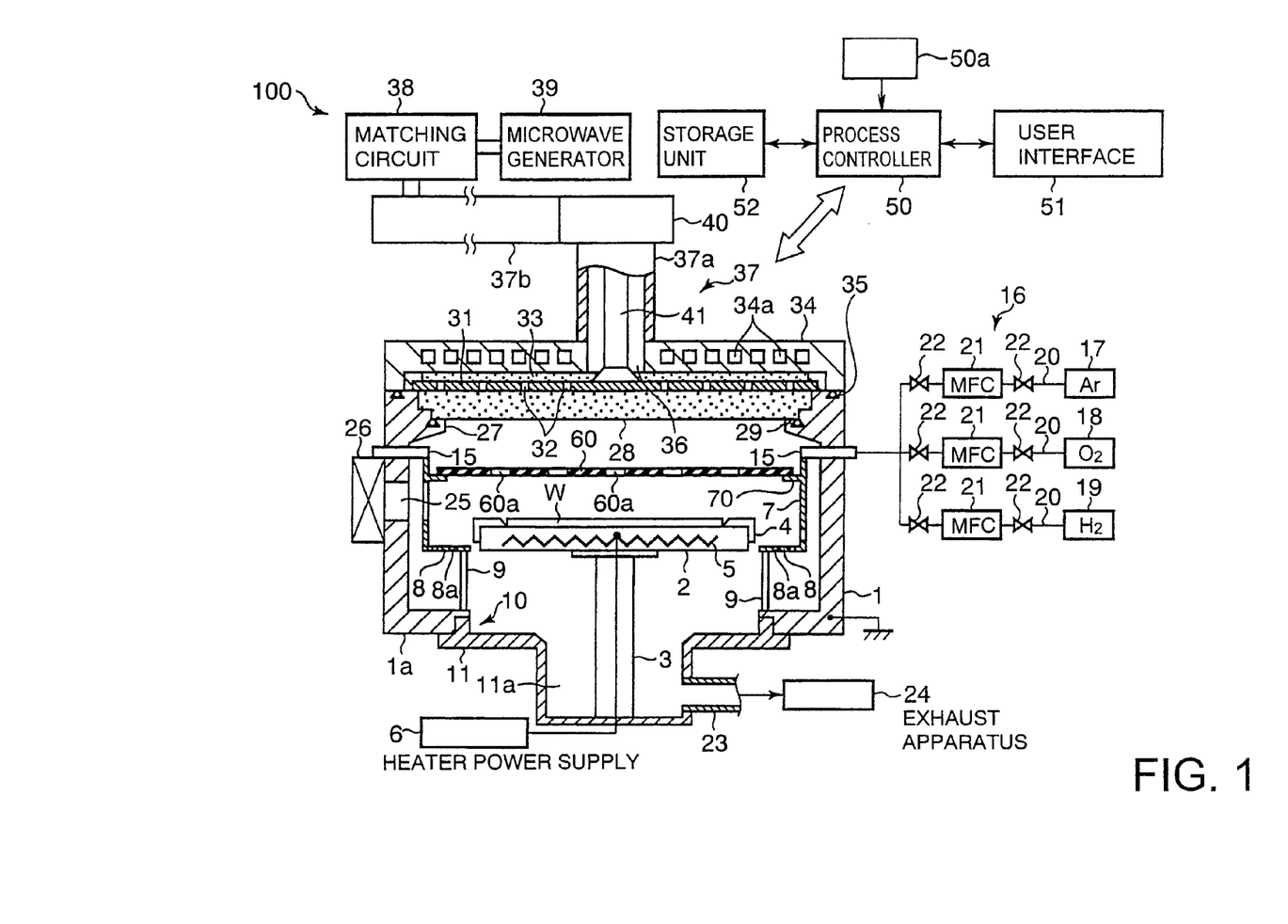
FIG. 1 is a schematic cross sectional view for illustrating one example of a plasma processing apparatus suitable for performing a method according to the present invention.

FIG. 1 is a cross sectional schematically showing one example of a plasma processing apparatus, which is suitable for performing a method for forming a silicon oxide film related to the present invention. This plasma processing apparatus includes a planar antenna, especially an RLSA (Radial Line Slot Antenna), having a plurality of slots formed therein. This RLSA-microwave-plasma-type processing apparatus is configured for generating plasma by introducing a microwave into a processing chamber via the planar antenna, thereby to generate microwave excitation plasma of a higher density and a lower electron temperature. For instance, this plasma processing apparatus is suitable for forming an insulating film used for various semiconductor devices, such as a gate insulating film for a transistor.

This plasma processing apparatus 100 has a chamber (or processing chamber) 1, which is airtightly sealed and grounded, and has a substantially cylindrical shape. A circular opening 10 is formed in a substantially central portion of a bottom wall 1a of the chamber 1. An exhaust chamber 11, which is communicated with the opening 10 and projected downward, is provided on the bottom wall 1a.

In the chamber 1, a susceptor 2 formed from ceramics, such as AlN or the like, is provided for horizontally supporting a semiconductor wafer (hereinafter, referred to as a "wafer") W that is an object to be processed. The wafer W has a concavo-convex pattern on a surface thereof, and is formed from silicon. The susceptor 2 is supported by a cylindrical support member 3 extending upward from a bottom central portion of the exhaust chamber 11 and formed from ceramics, such as AlN or the like. A guide ring 4 configured for guiding the wafer W is provided around the periphery of the susceptor 2. Additionally, a resistance heater 5 is embedded in the susceptor 2. This heater 5 is adapted for heating the susceptor 2, when supplied with electricity from a heater power supply 6. Therefore, the wafer W that is an object to be processed can also be heated together with the heated susceptor 2. The temperature of the heater 5 can be controlled within a range of, for example, from a room temperature to 800° C. It is noted that a cylindrical liner 7 formed from quartz is provided along an inner circumference of the chamber 1, while a baffle plate 8 having a plurality of exhaust holes 8a and formed from quartz is annularly provided, around an outer circumference of the susceptor 2, for uniformly evacuating the interior of the chamber 1. The baffle plate 8 is supported by a plurality of struts (supports) 9.

A wafer support pin or pins (not shown) are provided in the susceptor 2. Each wafer support pin is configured to be optionally projected from and retracted into a surface of the susceptor 2, thereby to raise and lower the wafer W, while supporting it thereon.

An annular gas introducing member 15 is provided through a side wall of the chamber 1, and has gas injection holes formed therein with an equal interval. A gas supply system 16 is connected with the gas introducing member 15. It is noted that the gas introducing member 15 may be provided to introduce a gas into the chamber 1, like a shower. The gas supply system 16 includes, for example, an Ar gas supply source 17, an $O_2$ gas supply source 18 and an $H_2$ gas supply source 19. Thus, such gases can be first supplied to the gas introducing member 15 via gas lines 20, and then uniformly introduced into the chamber 1 through the gas injection holes of the gas introducing member 15, respectively. On each of the gas lines 20, a mass flow controller 21 and opening and closing valves 22 located on both sides of the controller 21 are provided. It is noted that any other suitable rare gas, such as Kr, He, Xe or the like, may be used, in place of using the Ar gas. Alternatively, as will be described later, such a rare gas may not be used.

An exhaust pipe 23 is connected with a side wall of the exhaust chamber 11. An exhaust apparatus 24 including a high-pumping-speed vacuum pump is connected with the exhaust pipe 23. With actuation of the exhaust apparatus 24, the gas present in the chamber 1 can be uniformly evacuated into a space 11a of the exhaust chamber 11, and then discharged to the outside via the exhaust pipe 23. In this way, the pressure in the chamber 1 can be rapidly reduced up to a predetermined degree of vacuum, e.g., 0.133 Pa.

To the side wall of the chamber 1, a transfer port 25 and a gate valve 26 adapted for opening and closing the transfer port 25 are further provided. The transfer port 25 is configured for allowing the wafer W to be transferred between the plasma processing apparatus 100 and a carrier chamber (not shown) located adjacent to the apparatus 100.

An opening is provided in an upper portion of the chamber 1, and a ring-like support portion 27 is provided around the opening. To the support portion 27, a microwave transparent plate 28, which is formed of a dielectric of ceramics, such as quartz, $Al_2O_3$ or the like, and is transparent to the microwave, is airtightly provided via a sealing member 29. Thus, the interior of the chamber 1 can be kept in an airtightly sealed state.

Figure 2:
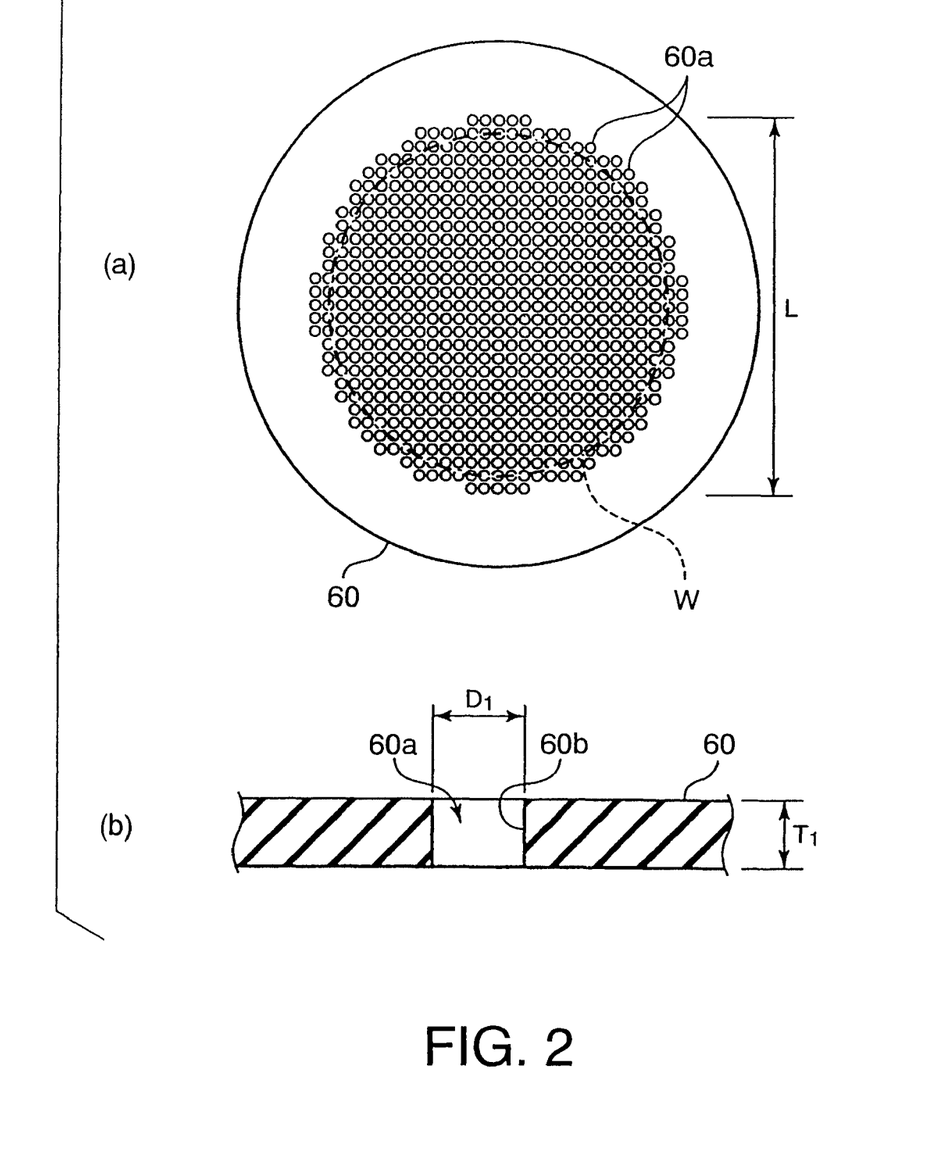
FIG. 2 is a view showing a structure of a planar antenna.

A disk-like planar antenna plate 31 is provided, above the microwave transparent plate 28, to be opposed to the susceptor 2. The planar antenna plate 31 is locked onto an upper end of the side wall of the chamber 1. When designed corresponding to, for example, an 8-inch sized wafer W, the planar antenna plate 31 is composed of a circular plate, which is formed from an electrically conductive material having a diameter of from 300 to 400 mm and a thickness of from 0.1 to several millimeters (e.g., 1 mm). More specifically, the planar antenna plate 31 is formed of a copper plate or aluminum plate having a surface plated with, for example, silver or gold. In such a planar antenna plate 31, multiple microwave radiation holes (or slots) 32 are formed, respectively in pairs, with a predetermined pattern, through the plate 31. Each microwave radiation hole 32 has, for example, an elongated groove-like shape as shown in FIG. 2, and each pair of the microwave radiation holes 32 which are adjacent to each other are typically arranged in a T-like shape. Furthermore, such multiple T-shaped pairs of microwave radiation holes 32 are arranged concentrically. It should be appreciated that the length of each microwave radiation hole 32 and the interval between adjacent lines in the concentric arrangement of the holes 32 are determined, respectively, depending on the wavelength (λg) of the microwave used. For instance, the interval between the concentric lines of the microwave radiation holes 32 is set to be λg/4, λg/2 or λg. In FIG. 2, such an interval between the adjacent lines in the concentric arrangement of the microwave radiation holes 32 is designated by Δr.

It is noted that each microwave radiation hole 32 may have any other suitable shape, such as a circle, an arc and the like. Furthermore, it is noted that the arrangement of the microwave radiation holes 32 is not limited in particular to such concentric arrangement as described above. For instance, these holes 32 may also be provided in spiral or radial arrangement.

On a top face of the planar antenna plate 31, a retardation member 33 is provided, which is formed from, for example, quartz or resin, such as polytetrafluoroethylene, polyimide or the like, having a dielectric constant greater than that of vacuum. Generally, the wavelength of the microwave is increased in the vacuum. Thus, the retardation member 33 is used to positively shorten such a wavelength of the microwave, so as to properly control the plasma. In the drawing, while the planar antenna plate 31 is depicted to be closely contacted with the microwave transparent plate 28 and the retardation member 33 is also depicted to be in close contact with the planar antenna plate 31, these plates and member may be suitably spaced apart from one another.

On a top face of the chamber 1, a shield cover 34 is provided to cover the planar antenna plate 31 and retardation member 33. The shield cover 34 is formed from a metallic material, such as aluminum, stainless steel, copper or the like. Further, the top face of the chamber 1 and shield cover 34 are sealed with a sealing member 35. The shield cover 34 and planar antenna plate 31 constitute together a waveguide passage that can propagate the microwave, uniformly and radially. In the shield cover 34, a cooling-water flow passage 34a is formed, so that the shield cover 34, retardation member 33, planar antenna plate 31 and microwave transparent plate 28 can be cooled together, with cooling water flowed through the passage 34a. It is noted that the shield cover 34 is grounded.

An opening 36 is formed in a central portion of a top wall of the shield cover 34. This opening is in communication with a waveguide 37. To one end of the waveguide 37 opposite to the opening, a microwave generator 39 is connected via a matching circuit 38. Thus, the microwave of, for example, a 2.45 GHz frequency, generated from the microwave generator 39 can be propagated to the planar antenna plate 31 via the waveguide 37. It is noted that the frequency, such as 8.35 GHz, 1.98 GHz or the like, may also be used as the frequency for the microwave.

The waveguide 37 includes a coaxial waveguide 37a having a circular cross section and extending upward from the opening 36 of the shield cover 34, and a rectangular waveguide 37b connected with a top end of the coaxial waveguide 37a via a mode converter 40 and extending in the horizontal direction. The mode converter 40 provided between the rectangular waveguide 37b and the coaxial waveguide 37a can serve to change the microwave propagated in a TE mode through the rectangular waveguide 37b, into a TEM mode. An internal conductor 41 extends along a central axis of the coaxial waveguide 37a, with a bottom end portion of the internal conductor 41 being connected and fixed to a center of the planar antenna plate 31. As such, the microwave can be propagated, uniformly and efficiently, to the planar antenna plate 31 via the internal conductor 41 of the coaxial waveguide 37a.

Each component of the plasma processing apparatus 100 is connected with and controlled by a process controller 50 provided with a CPU. Further, a user interface 51, including a keyboard for allowing an operator to perform an input operation of commands used for controlling the plasma processing apparatus 100, a display adapted for visualizing and displaying operational conditions of the plasma processing apparatus 100, and the like, is connected with the process controller 50.

Furthermore, a storage unit 52, is connected to the process controller 50, for storing therein control programs (or software) for performing various processes in the plasma processing apparatus 100 under control of the process controller 50 and/or recipes, on which data concerning process conditions and the like are written.

Thus, a desired process can be performed, as needed, in the plasma processing apparatus 100, under the control of the process controller 50, by reading any given suitable recipe from the storage unit 52 and driving the process controller 50 to execute the recipe, in response to an inputted command or the like from the user interface 51. In regard to the recipes for the control programs and/or data concerning the process conditions, those stored in a computer-readable storage medium 50a, such as a CD-ROM, a hard disk, a flexible disk, a flash memory and the like, can be utilized. Otherwise, such recipes are also available, online, by transmitting them, at any time, from another apparatus, via a dedicated line.

In short, the plasma processing apparatus 100 constructed as described above can achieve a substantially uniformed plasma process, and thus form a significantly high quality film, while suppressing occurrence of undesired damage of the film, even under a relatively low temperature condition of, for example, 800° C. or lower, more preferably 500° C. or lower.

For example, the plasma processing apparatus 100 is well applicable to the case of forming the silicon oxide film used as the gate insulating film for the transistor, as well as applicable to the case of forming a similar oxide film in a trench for the so-called STI (Shallow Trench Isolation) technique utilized as a device separation technique in a process for manufacturing the semiconductor device.

Figure 3:
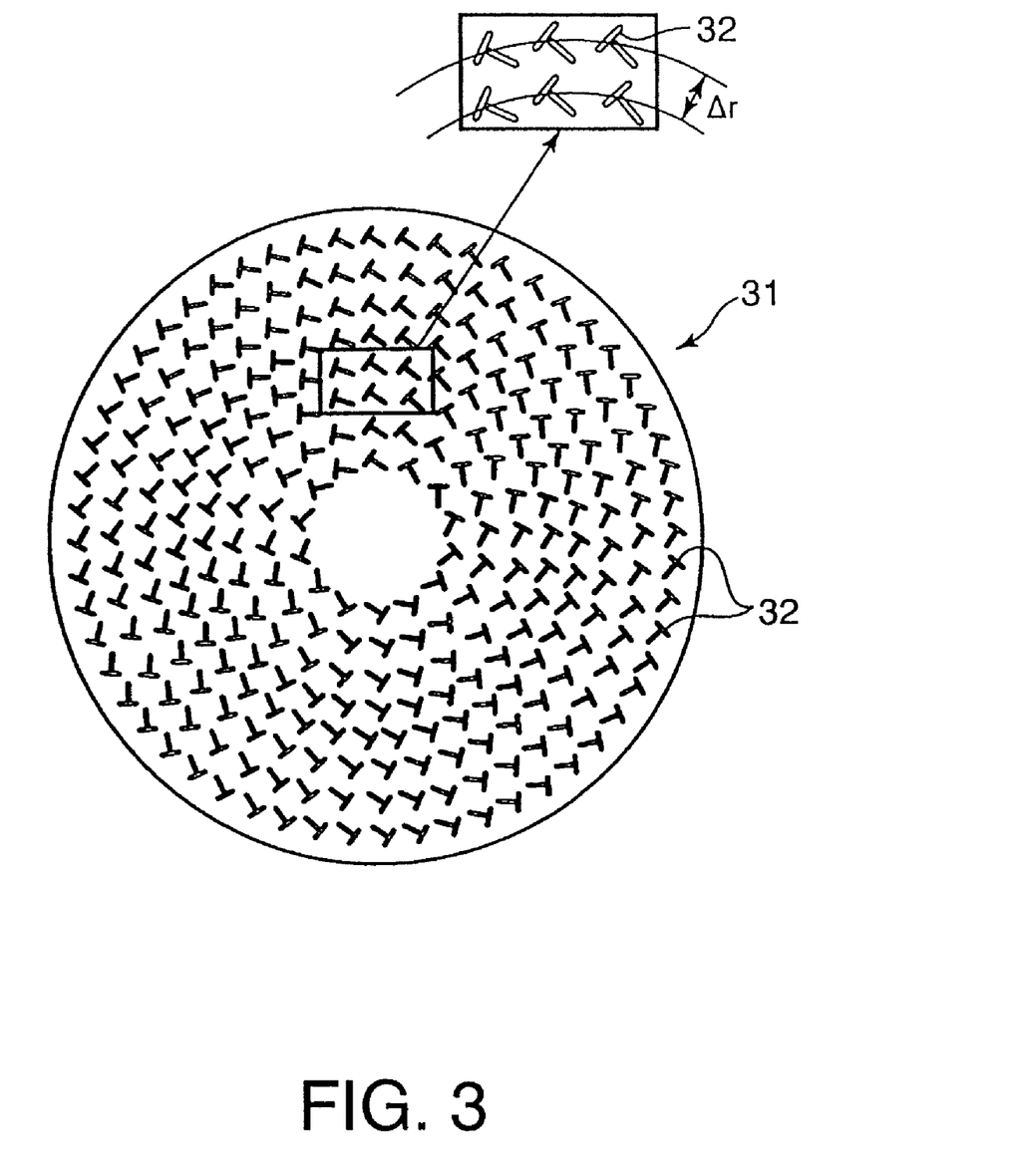
FIG. 3 is a flow chart showing one example of a procedure of the method for forming a silicon oxide film related to the present invention.

Next, a method for forming the silicon oxide film by using the plasma processing apparatus 100 will be discussed. FIG. 3 is a flow chart schematically showing a procedure of the method for forming the silicon oxide film related to one embodiment of the present invention. In the method for forming the silicon oxide film of this embodiment, first in a step S2, a first oxidation step is performed under a first process condition that is a lower-pressure and lower-oxygen-concentration condition, then in a second step S3, a second oxidation step is performed under a second process condition that is a higher-pressure and higher-oxygen-concentration condition, as compared with the first process condition. Now, the first and second oxidation steps will be described in more detail, respectively.

First, the gate valve 26 is opened. Then, the wafer W formed from silicon and having concavo-convex recesses, such as trenches, formed therein is carried from the transfer port 25 into the chamber 1, and is placed on the susceptor 2 (Step S1). Thereafter, the Ar gas and $O_2$ gas are introduced into the chamber 1, via the gas introducing member 15, from the Ar gas supply source 17 and $O_2$ gas supply source 18 of the gas supply system 16, at predetermined flow rates, respectively. Then, the pressure in the chamber 1 and the temperature of the susceptor 2 are respectively controlled to be matched with the first process condition. For the first process condition, the ratio of the oxygen in the processing gas is preferably, for example, 1% or less, more preferably within a range of 0.2 to 1%. Further, in the processing gas, the flow rate of the Ar gas is set within a range of 50 to 5000 mL/min, while the flow rate of the $O_2$ gas is set within a range of 0.5 to 50 mL/min, wherein these flow rates can be selected, respectively, such that the ratio of the oxygen relative to the total gas flow rate will be within the above range.

Preferably, the processing pressure is 133 Pa or less, more preferably within a range of 90 to 133 Pa.

The processing temperature can be selected from a range of 200° C. to 800° C., and is preferably within a range of 400° C. to 500° C.

Further, an $H_2$ gas can be introduced into the chamber 1, from the $H_2$ gas supply source 19, at a predetermined ratio, in addition to the Ar gas and $O_2$ gas respectively introduced from the Ar gas supply source 17 and $O_2$ gas supply source 18. With the supply of the $H_2$ gas, an oxidation rate in the plasma oxidation process can be significantly enhanced.

This is because OH radicals that can directly contribute to the enhancement of the oxidation rate can be adequately produced by such supply of the $H_2$ gas. In this case, the ratio of the $H_2$ gas, relative to the total amount of the processing gas, is within a range of 0.1 to 10%, preferably within a range of 0.1 to 5%, more preferably within a range of 0.1 to 2%.

Subsequently, the microwave generated from the microwave generator 39 is introduced into the waveguide 37 through the matching circuit 38. Then, the microwave is supplied to the planar antenna plate 31 through the rectangular waveguide 37b, mode converter 40 and coaxial waveguide 37a, successively. Thereafter, the microwave is radiated toward a space above the wafer W in the chamber 1 through the microwave transparent plate 28 from the microwave radiation holes 32 of the planar antenna 31. In this case, the microwave is propagated in the TE mode through the rectangular waveguide 37b, and then changed into the TEM mode by the mode converter 40. Thereafter, the microwave is propagated toward the planar antenna 31 through the coaxial waveguide 37a. Preferably, the power of the microwave generator is set within a range of 0.41 to 4.19 W/cm$^2$, or a range of 0.5 to 5 kW.

As a result, an electromagnetic field is created in the chamber 1, due to the microwave radiated into the chamber 1 through the microwave transparent plate 28 from the microwave radiation holes 32 of the planar antenna plate 31. Thus, the Ar gas, $O_2$ gas and the like are changed into plasma, then the silicon surface exposed to the outside in each recess formed in the wafer W is oxidized by the so-generated plasma. In this manner, the first oxidation step is performed (Step S2).

This microwave excitation plasma has relatively high density of approximately $1\times10^{10}$ to $5\times10^{12}$/cm$^3$ or higher, because such a microwave is radiated from the multiple microwave radiation holes 32 of the planar antenna plate 31. Besides, the electron temperature of the plasma is within a range of approximately 0.5 to 2 eV, and uniformity of the plasma density is ±5% or lower. Accordingly, a highly thin and uniform oxide film can be formed, by performing the oxidation process, in a relatively short time, at a lower temperature and a higher oxidation rate. Additionally, this oxidation process can successfully suppress occurrence of damage of the oxide film caused by ions or the like in the plasma, thus forming the silicon oxide film with higher quality.

The first oxidation step utilizes, at a maximum, advantageous points of the higher oxidation rate that is peculiar to the first process condition, i.e., the lower-pressure and lower-oxygen-concentration condition, as compared with the second process condition in the second oxidation step performed following the first oxidation step. Therefore, the first oxidation step is continued until the time just before the thickness of the formed silicon oxide film reaches an aimed film thickness. More specifically, the first oxidation process is performed until the thickness of the formed silicon oxide film reaches about 95%, preferably about 99%, more preferably about 99.9%, of the aimed film thickness.

Following the first oxidation step, the plasma is generated under the second process condition, so as to perform the second oxidation step for forming an additional silicon oxide film, by oxidizing the silicon on the surface of the wafer W, by using the so-generated plasma (Step S3). In the second oxidation step, the Ar gas and $O_2$ gas are introduced into the chamber 1, via the gas introducing member 15, from the Ar gas supply source 17 and $O_2$ gas supply source 18 of the gas supply system 16, at predetermined flow rates, respectively. Then, the pressure in the chamber 1 and the temperature of the susceptor 2 are respectively controlled to be matched with the second process condition.

For the second process condition, the ratio of the oxygen in the processing gas is preferably within a range of, for example, 20 to 100%, preferably 20 to 50%, and more preferably 20 to 30%. Additionally, in the processing gas, the flow rate of the Ar gas is set within a range of 0 to 5000 mL/min, while the flow rate of the $O_2$ gas is set within a range of 10 to 5000 mL/min, wherein these flow rates can be selected, respectively, such that the ratio of the oxygen relative to the total gas flow rate will be within the above range.

Preferably, the processing pressure is within a range of 400 to 1333 Pa, more preferably 400 to 667 Pa.

The processing temperature can be selected from a range of 200° C. to 800° C., and is preferably within a range of 400° C. to 500° C.

Under the second process condition, $H_2$ gas can be introduced into the chamber 1, from the $H_2$ gas supply source 19, at a predetermined ratio, in addition to the Ar gas and $O_2$ gas respectively introduced from the Ar gas supply source 17 and $O_2$ gas supply source 18. In this case, the ratio of the $H_2$ gas is preferably within a range of 0.1 to 10%, more preferably 0.1 to 5%, and more preferably 0.1 to 2%, relative to the total amount of the processing gas. However, because there is no necessity for enhancing the oxidation rate in the second oxidation step performed in a shorter time as compared with the first oxidation step, such addition of the $H_2$ gas is an option.

Subsequently, the microwave generated from the microwave generator 39 is introduced into the waveguide 37 through the matching circuit 38. Then, the microwave is supplied to the planar antenna plate 31 through the rectangular waveguide 37b, mode converter 40 and coaxial waveguide 37a, successively. Thereafter, the microwave is radiated toward the space above the wafer W in the chamber 1 through the microwave transparent plate 28 from the planar antenna 31. In this case, the microwave is propagated in the TE mode through the rectangular waveguide 37b, and then changed into the TEM mode by the mode converter 40. Thereafter, the microwave is propagated through the coaxial waveguide 37a toward the planar antenna 31. At this time, the power of the microwave generator 39 is preferably controlled within the range of 0.41 to 4.19 W/cm$^2$, or a range of 0.5 to 5 kW.

In this manner, the second oxidation step is ended (Step S4), and then the substrate is carried out from the chamber 1.

As described above, the second oxidation step is performed under the higher-pressure and higher-oxygen-concentration condition, as compared with the first process condition for the preceding first oxidation step. Rather than increasing the film thickness of the silicon oxide film, the main purpose of this second oxidation step is to improve the quality of the silicon oxide film formed in the first oxidation step.

Accordingly, in view of shortening the time required for the entire process, it is preferred that the process time for the second oxidation step is set to be relatively short, after the plasma generated in the chamber 1 is stabilized. For instance, such process time is set at 600 seconds or shorter, preferably within a range of 1 to 60 seconds, more preferably 1 to 10 seconds, and more preferably 5 to 10 seconds, in view of the stabilization of the plasma.

The film thickness of the silicon oxide film formed in the second oxidation step is 5% or less, preferably 1 to 0.1%, relative to the aimed film thickness or total film thickness of the silicon oxide film formed through both of the first and second oxidation steps.

Namely, by employing such a two-step plasma oxidation process incorporating the first oxidation step performed under the first process condition of the lower pressure and lower oxygen concentration and the second oxidation step performed under the second process condition of the higher pressure and higher oxygen concentration, the silicon oxide film excellent in the insulating properties can be formed at a higher oxidation rate. Thus, the semiconductor device, which employs the silicon oxide film formed by this method, as the insulating film thereof, can exhibit highly desired electric properties.

Figure 4:
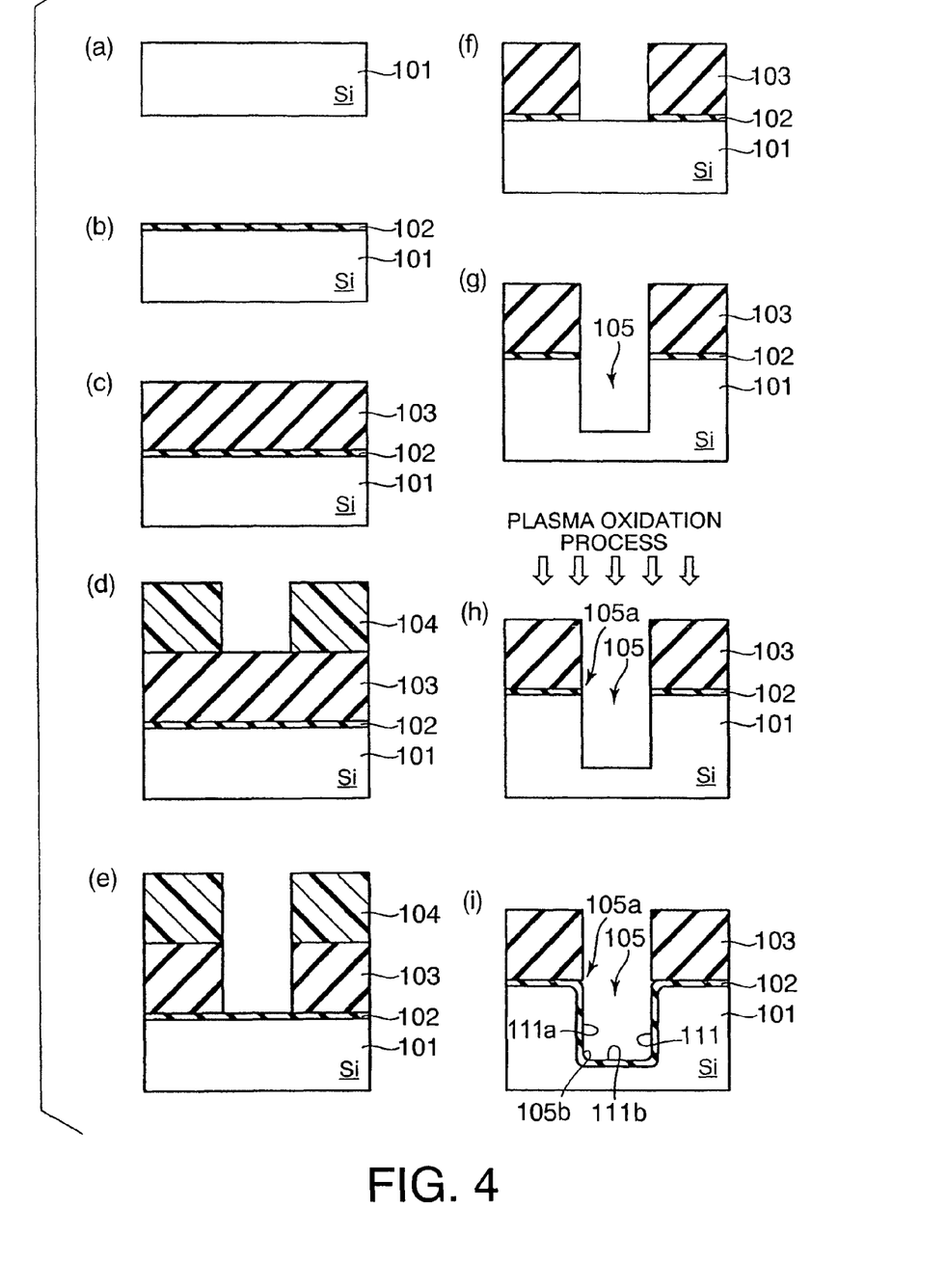

Referring now to FIG. 4, one example, in which the method for forming the silicon oxide film related to the present invention is applied to formation of an oxide film in one exemplary trench for the STI, will be discussed. FIGS. 4(a) to 4(i) are schematic diagrams, respectively illustrating an exemplary procedure for forming the trench for the STI and then forming the oxide film therein.

First, as shown in FIGS. 4(a) and 4(b), a typical silicon oxide film 102, such as $SiO_2$ or the like, is formed on a silicon substrate 101, by thermal oxidation or the like. Then, as shown in FIG. 4(c), a silicon nitride film 103, such as $Si_3N_4$ or the like, is formed on the silicon oxide film 102, such as by CVD (Chemical Vapor Deposition). Thereafter, as shown in FIG. 4(d), a photoresist is coated on the silicon nitride film 103, and a resist layer 104 is then formed on the silicon nitride film 103, by patterning, in accordance with the photolithography.

Subsequently, the silicon nitride film 103 and silicon oxide film 102 are selectively etched, by using, for example, a halogen-based etching gas, with the resist layer 104 used as an etching mask. Consequently, the silicon substrate 101 is exposed to the outside, corresponding to the pattern of the resist layer 104 (FIG. 4(e)). As a result, a mask pattern for forming the trench is formed from the silicon nitride film 103. FIG. 4(f) shows a state, in which the resist layer 104 is removed by the so-called ashing process performed with, for example, oxygen containing plasma using a suitable processing gas containing oxygen or the like.

In FIG. 4(g), a typical trench 105 is formed by selectively etching the silicon substrate 101, with the silicon nitride film 103 and silicon oxide film 102 respectively used as a proper mask. This etching can be performed, either by using a halogen or halogen compounds, such as $Cl_2$, HBr, $SF_6$, $CF_4$ or the like, or by using a suitable etching gas containing $O_2$ or the like.

FIG. 4(h) shows a process for forming the silicon oxide film on the trench 105 formed in the wafer W after the etching process for the STI. In this case, the plasma oxidation process, including the first oxidation step performed under the first process condition of the lower pressure and lower oxygen concentration and the second oxidation step performed under the second process condition of the higher pressure and higher oxygen concentration, is performed to the trench 105. With such a two-step plasma oxidation process, each shoulder portion 105a of the trench 105 in the silicon substrate 101 can be successfully rounded. Such a rounded shoulder portion 105a of the trench 105 in the silicon substrate 101 can significantly suppress occurrence of a leak current, as compared with the trench 105 having an acute shape at each shoulder portion thereof. Similarly, the above two-step plasma oxidation process can also form each bottom edge portion 105b of the trench 105 into a properly rounded shape. Furthermore, by using this two-step plasma oxidation process, desired silicon oxide films 111a, 111b can be formed on inner faces (i.e., side and bottom faces) of the trench 105, with a substantially uniform film thickness, without surface orientation dependent properties in the formation of the silicon oxide film. This effect can be considered to be obtained under such a condition that $O(^1D_2)$ radicals are generated, predominantly, in the plasma, in the first oxidation step performed under the first process condition of the lower-pressure and lower-oxygen-concentration condition.

After the silicon oxide film 111 is formed by the method for forming the silicon oxide film according to the present invention, the insulating film, such as $SiO_2$, is formed or embedded in the trench 105, such as by the CVD, in accordance with a procedure of forming a device separation region for the STI. Thereafter, the entire surface is flattened, by polishing, such as CMP (Chemical Mechanical Polishing) or the like method, with the silicon nitride film 103 used as a stopper layer. After this flattening step, the silicon nitride film 103 and an upper portion of the embedded insulating film are removed by etching, thus forming a device separation structure.

Next, a result of a test for checking the effect of the present invention will be described.

Figure 5:
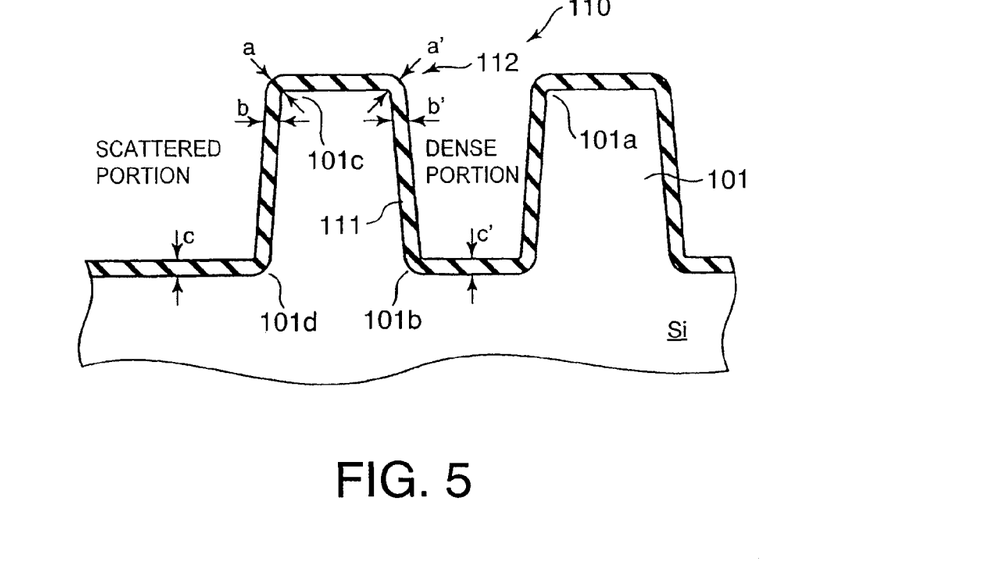
FIG. 5 is a graph showing a result of a TZDB test.

FIG. 5 shows the result of an assessment test (i.e., a TZDB test) on reliability of the insulating film. This test used the silicon oxide films respectively formed on EPI substrates (or single crystal substrates), by the plasma oxidation process performed under the following conditions A and B. Specifically, MOS-capacitors were prepared for the assessment, by using such silicon oxide films, respectively. It is noted that the film thickness (Tox) of each silicon oxide film measured in the TZDB test was 11.5 nm, the area (S) of each cell used for the test was 5 $mm^2$, and the number of points measured in the test was 112.

(Condition A: The Method of this Invention) (i.e., the Two-Step Process)
First Oxidation Step: Plasma Oxidation Process Under the Lower-Pressure and Lower-Oxygen-Concentration Condition
   Flow rate of the Ar gas: 500 mL/min (sccm)
   Flow rate of the $O_2$ gas: 5 mL/min (sccm)
   Flow rate of the $H_2$ gas: 5 mL/min (sccm)
   Ratio of the $O_2$ gas: approximately 1%
   Processing pressure: 133.3 Pa (1 Torr)
   Power of the microwave: 2.3 $W/cm^2$ (2750 W)
   Processing temperature: 400° C.
   Process time: 235 seconds
Second Oxidation Step: Plasma Oxidation Process Under the Higher-Pressure and Higher-Oxygen-Concentration Condition
   Flow rate of the Ar gas: 120 mL/min (sccm)
   Flow rate of the $O_2$ gas: 37 mL/min (sccm)
   Flow rate of the $H_2$ gas: 3 mL/min (sccm)
   Ratio of the $O_2$ gas: approximately 23%
   Processing pressure: 666.5 Pa (5Torr)
   Power of the microwave: 2.3 $W/cm^2$ (2750 W)
   Processing temperature: 400° C.
   Process time: 10 seconds, 30 seconds, 60 seconds and 700 seconds
(Condition B: A Comparative Method) (i.e., Only the Plasma Oxidation Process Under the Lower-Pressure and Lower-Oxygen-Concentration Condition)
   Flow rate of the Ar gas: 500 mL/min (sccm)
   Flow rate of the $O_2$ gas: 5 mL/min (sccm)
   Flow rate of the $H_2$ gas: 5 mL/min (sccm)
   Ratio of the $O_2$ gas: approximately 1%
   Processing pressure: 133.3 Pa (1 Torr)
   Power of the microwave: 2.3 $W/cm^2$ (2750 W)
   Processing temperature: 400° C.
   Process time: 235 seconds As is seen from FIG. 5, the yield (a criterion for passing the assessment test: >15 MV/cm) can be significantly enhanced and the initial pressure resistance can be highly improved, in the case of employing the method according to the present invention, in which the plasma process is performed under the two-step condition A (i.e., the lower-pressure and lower-oxygen-concentration condition+the higher-pressure and higher-oxygen-concentration condition), as compared with the case of employing the above comparative method, in which the silicon oxide film is formed by the plasma process under the condition B (i.e., only the lower-pressure and lower-oxygen-concentration condition, with the time for the process under the higher-pressure and higher-oxygen-concentration condition incorporated in the condition A being zero).

Figure 6:
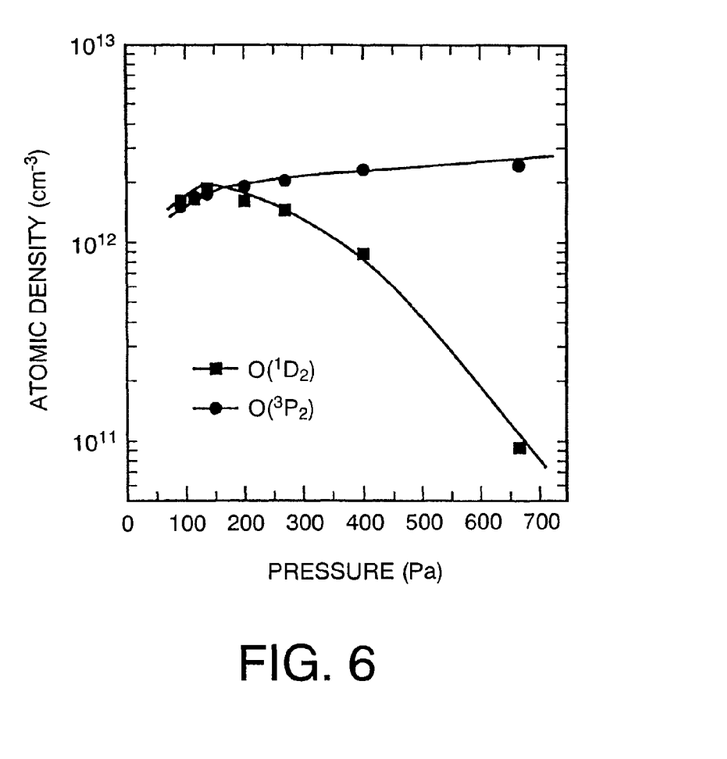
FIG. 6 is a graph showing a relationship between the process time and intensity of oxygen light emission in plasma.

Additionally, it is found that the time for the second oxidation process necessary for improving the yield is approximately 10 seconds or so. Accordingly, in order to shorten the total time required for forming a desired silicon oxide film, it is necessary to take time, as much as possible, for performing the first oxidation step under the lower-pressure and lower-oxygen-concentration condition with a higher oxygen rate, while it is preferred that the process time for the second oxidation step is controlled within an appropriate range that has only to obtain an effect sufficient for enhancing the yield. However, in order to keep the reproducibility of the process at a desired level, it is also preferred that the plasma is stabilized, for a period of time, after the second oxidation step is started by turning on the power for the microwave to generate the plasma. FIG. 6 shows a relationship between the process time and a light emission spectrum (OES) of the oxygen radicals in the plasma at a frequency of 777 nm. From this drawing, it can be seen that the stabilization of the light emission of the oxygen radicals requires approximately 5 seconds, after the power for the microwave was turned on at 34 seconds in the process time. Thus, the process time for the second oxidation step is preferably set within a range of, for example, 600 seconds or shorter, preferably 1 to 60 seconds, more preferably 1 to 10 seconds, and more preferably 5 to 10 seconds.

Further, the plasma oxidation process was performed, under the aforementioned conditions A and B as well as under the following condition C, respectively. For each of the silicon oxide films formed under such conditions, the oxidation rate in the plasma oxidation process, shape of each shoulder portion of the pattern, surface orientation dependent properties in the formation of the silicon oxide film, time-dependent dielectric breakdown test (TDDB test), resistance to etching, amount of loss (E') of Si—O bonds in the film measured by ESR (Electron Spin Resonance) analysis, and roughness of an interface between $SiO_2$/Si were checked, respectively. The results of these checks are shown in Table 1. It is noted that Table 1 also shows the results of the aforementioned TZDB test (Time Zero Dielectric Breakdown test).

(Condition C: Another Comparative Method) (i.e., Only the Plasma Oxidation Process Under the Higher-Pressure and Higher-Oxygen-Concentration Condition)

Flow rate of the Ar gas: 120 mL/min (sccm)
Flow rate of the $O_2$ gas: 37 mL/min (sccm)
Flow rate of the $H_2$ gas: 3 mL/min (sccm)
Ratio of the $O_2$ gas: approximately 23%
Processing pressure: 666.5 Pa (5Torr)
Power of the microwave: 2.3 W/cm$^2$ (2750 W)
Processing temperature: 400° C.
Process time: 1500 seconds

TABLE 1

| Test items | Condition A (Two-step process) | Condition B (Lower-pressure and lower-oxygen-concentration) | Condition C (Higher-pressure and higher-oxygen-concentration) |
|---|---|---|---|
| Oxidation rate | Good (significantly high) | Good (high) | Applicable (slightly low) |
| Shape of each shoulder portion in the pattern | Good (properly rounded) | Good (rounded) | Inapplicable (acute) |
| Surface orientation dependent properties | Good (low) | Good (low) | Inapplicable (high) |
| TZDB test | Good (high yield) | Inapplicable (low yield) | Good (high yield) |
| TDDB test | Good (high yield) | Good (high yield) | Inapplicable (low yield) |
| Resistance to etching (in treatment with a diluted hydrofluoric | Good (high) | Inapplicable (low) | Good (high) |
| ESR analysis (amount of loss (E') of Si-O bonds) | Good (lower than a detection limit) | Inapplicable (high) | Good (lower than the detection limit) |
| Roughness of the interface between $SiO_2$/Si (flatness) | Good (flat) | Good (flat) | Inapplicable (rough) |

Figure 7:
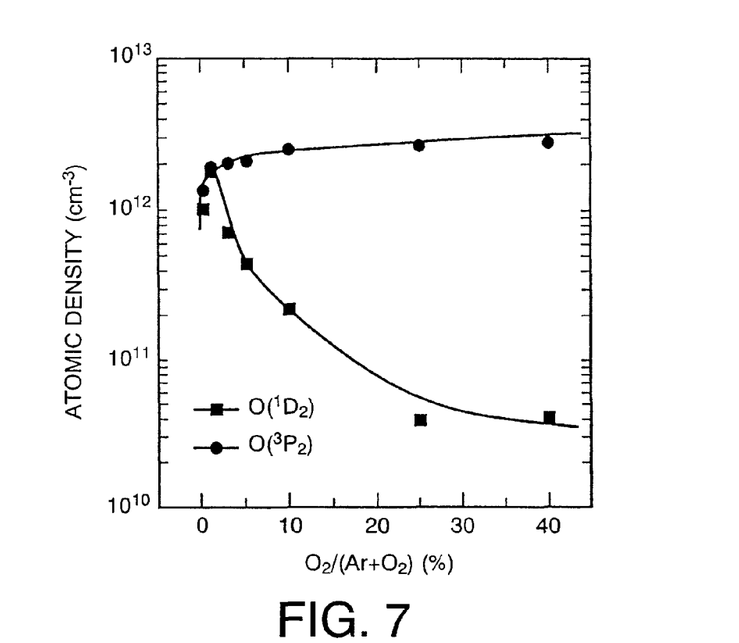
FIG. 7 is schematic diagram showing a cross section of a portion in the vicinity of a wafer surface having a pattern formed therein.

The shape of each shoulder portion in the pattern was assessed, by observing whether or not each shoulder portion 112 in the pattern of each single crystal silicon substrate 101 is properly rounded, after the formation of the silicon oxide film 111 by providing the plasma oxidation process to the surface of the silicon substrate 101 having an exemplary concavo-convex pattern 110 as shown in FIG. 7, under each of the conditions A to C. The surface orientation dependent properties in the formation of each silicon oxide film was evaluated by measuring a difference in the oxidation rate between a (100) face and a (110) face of the film, from the respective film thicknesses of portions a, b as shown in FIG. 7. It is noted that a ratio between the depth of each recess and the width thereof (i.e., an aspect ratio) in the pattern 110 was 2.5.

In the TDDB test, the MOS-capacitors (not shown) were prepared, by using the silicon oxide films respectively formed under the above conditions A to C, and then assessed, in the same manner as in the TZDB test.

The resistance to etching was assessed, for an amount of reduction in the film thickness of each silicon oxide film, measured after wet etching performed by dipping the silicon oxide film in a diluted hydrofluoric acid (HF:$H_2O$=1:100) for ten seconds. The silicon oxide films respectively formed under the above conditions A to C were used as each test sample. It is noted that lower reduction in the film thickness measured after the wet etching demonstrates higher density and quality of the film.

The amount of loss E' of the Si—O bonds in the silicon oxide film was measured by using an ESR (Electron Spin Resonance) analyzer, for the silicon oxide films respectively formed under the above conditions A to C. In this case, the detection limit, for the amount of loss E' of the Si—O bonds, was set lower than approximately $5 \times 10^{16}$ [spins/cm$^3$].

The roughness (i.e., root-means-square roughness (Rms)) of the interface between $SiO_2$/Si was measured by AFM (Atomic Force Microscope) analysis.

As apparently seen from Table 1, in the case of employing the method of the present invention based on the two-step plasma process performed under the condition A, i.e., the lower-pressure and lower-oxygen-concentration condition+ the higher-pressure and higher-oxygen-concentration condition, the higher oxidation rate, rounded shoulder portions 112 in the pattern and proper control of the surface orientation dependent properties, all of which are advantageous points achieved by the plasma oxidation process performed under the condition B, i.e., the lower-pressure and the lower-oxygen-concentration condition, can be maintained, while the lower yield as seen in the initial pressure resistance test and insufficient quality of the silicon oxide film, which are disadvantageous points associated with the plasma oxidation process performed under the condition B, can be significantly improved, due to the plasma process performed in the second oxidation step under the higher-pressure and higher-oxygen-concentration condition. This demonstrates that such a two-step plasma process performed under the condition A can provide an excellent silicon oxide film with higher density (i.e., excellent in the resistance to etching) and a lower amount of defects or loss (E') of the Si—O bonds.

Thus, from the results of the above tests, it was confirmed that the two-step plasma process, for forming the silicon oxide film, performed under the lower-pressure and lower-oxygen-concentration condition+the higher-pressure and the higher-oxygen-concentration condition, can successfully utilize the advantageous points of the plasma oxidation process performed under the lower-pressure and lower-oxygen-concentration condition, while compensating for the disadvantageous points thereof. Next, the reason for such an effect will be discussed.

Figure 8:
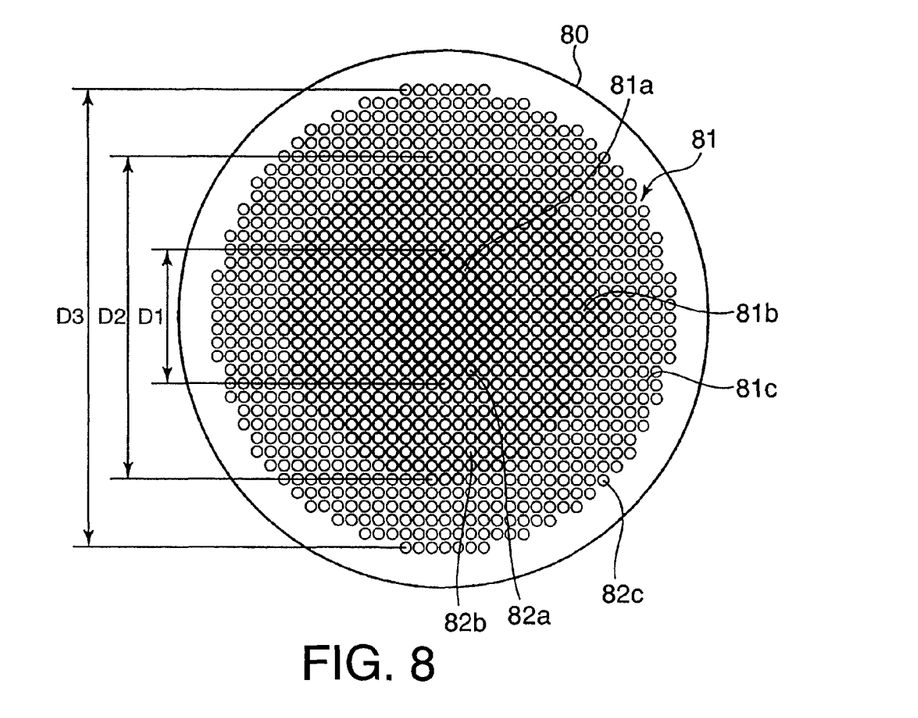
FIG. 8 is a graph showing a relationship between processing pressure and density of radicals in the plasma.

FIG. 8 is a graph showing a relationship between the processing pressure and atomic density of radicals, such as $O(^1D_2)$ and $O(^3P_2)$, in the plasma produced in the plasma processing apparatus 100. In this case, the condition for generating the plasma comprises Ar flow rate of 500 mL/min (sccm); $O_2$ flow rate of 5 mL/min (sccm) [with the ratio of the $O_2$ gas being approximately 1%]; processing temperature of 400° C.; and microwave power of 1500 W (1.25 W/cm$^2$), wherein the processing pressure is changed within a range of from 90 to 667 Pa.

From the results shown in FIG. 8, it can be seen that the density of $O(^1D_2)$ may tend to reach its peak value in the vicinity of 133.3 Pa, while being rapidly decreased, with further elevation of the processing pressure, as compared with the density of $O(^3P_2)$.

Figure 9:
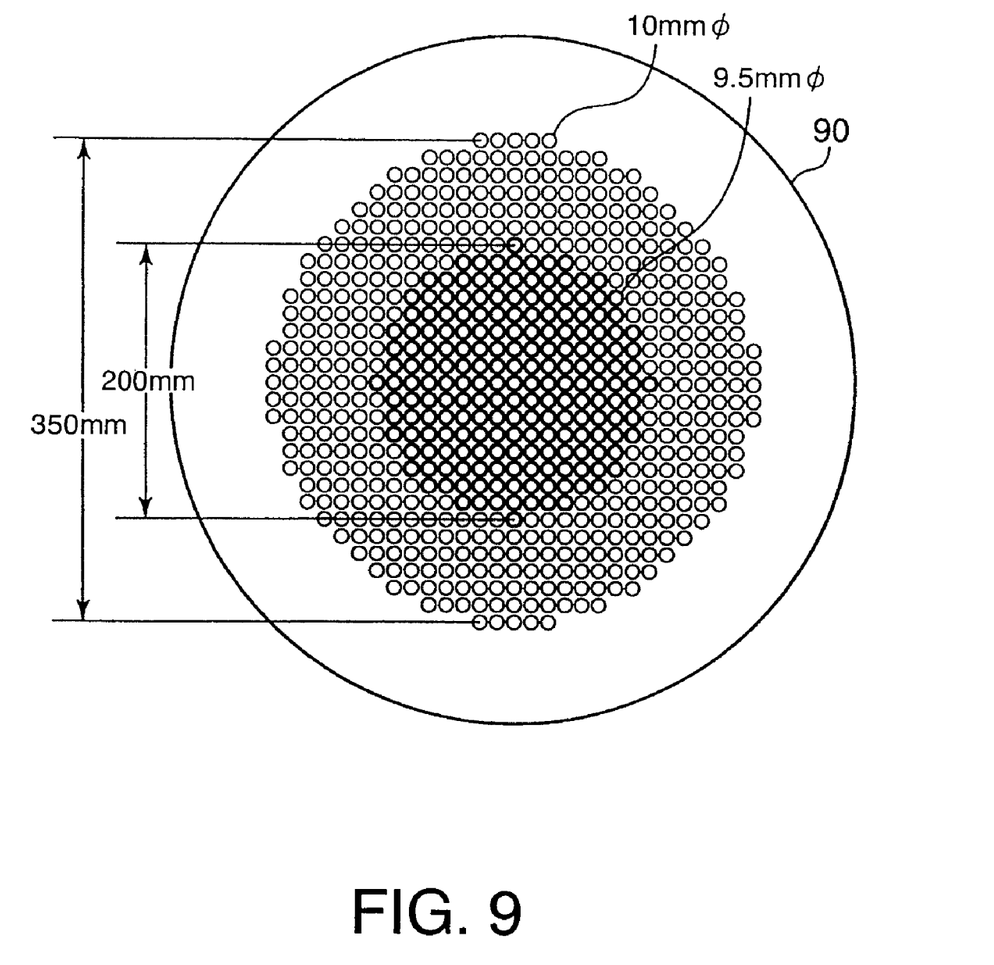
FIG. 9 is a graph showing a relationship between a ratio of a flow rate of a processing gas and the density of the radicals in the plasma.

FIG. 9 is a graph showing a relationship between a ratio of the flow rate of the processing gas and the density of $O(^1D_2)$ and $O(^3P_2)$ in the plasma. In this case, the condition for generating the plasma comprises processing pressure of 133.3 Pa (1 Torr); processing temperature of 400° C.; microwave power of 1500 W (1.25 W/cm$^2$); Ar flow rate of 300 to 500 mL/min (sccm); and $O_2$ flow rate of 1 to 200 mL/min (sccm), wherein the ratio of the $O_2$ gas flow rate (i.e., ($O_2$/Ar+$O_2$)×100) is changed within a range of 0.2 to 40%.

From FIG. 9, it can be seen that the density of $O(^3P_2)$ is hardly influenced by the change of the ratio of the $O_2$ gas flow rate (i.e., ($O_2$/Ar+$O_2$)×100) in the processing gas, while the density of $O(^1D_2)$ becomes higher as the ratio of the $O_2$ gas flow rate in the processing gas is lowered, with a steep peek in the vicinity of 1% $O_2$ gas flow rate.

From FIGS. 8 and 9, it can be seen that the plasma with substantially the highest density of $O(^1D_2)$ and $O(^3P_2)$ is produced, under the lower-pressure and lower-oxygen-concentration condition of 133.3 Pa pressure and 1% $O_2$ concentration, in the plasma processing apparatus 100. Accordingly, in the first oxidation step, the effect of the higher oxidation rate, formation of the rounded shoulder portions 112 in the pattern and proper control of the surface orientation dependent properties can be obtained, by oxidizing the silicon with the plasma mainly consisting of such radicals, i.e., $O(^1D_2)$ and $O(^3P_2)$. Meanwhile, in the second oxidation step under the higher-pressure and higher-oxygen-concentration condition, as is seen from FIGS. 8 and 9, the silicon oxide film formed in the first oxidation step is further exposed to the plasma mainly containing the $O(^3P_2)$ radicals. As such, the silicon oxide film can be substantially modified, resulting in positive improvement of the lower yield of the film as is seen in the initial pressure resistance test and insufficient quality thereof, thereby achieving a highly excellent silicon oxide film with higher density (or higher resistance to etching) and lower defects or loss (E') of the Si—O bonds.

While one preferred embodiment of the present invention has been discussed above, this invention is not limited in particular to this embodiment, and various modifications and/or alterations can be made thereto without departing from the scope and spirit of this invention. For instance, while the plasma processing apparatus 1 of the RLSA type has been mentioned with reference to FIG. 1, any other suitable type of the plasma processing apparatus, such as an ICP type, ECR type, surface reflected wave type, magnetron type or the like, may also be used herein.

Additionally, the present invention is suitable for many applications required for forming a high-quality oxide film on and along such a concavo-convex pattern as shown in FIG. 7. For instance, this invention can be applied to the formation of the oxide film in the trench used for the STI as well as applied to the formation of the oxide film on a side wall of a poly silicon gate electrode of the transistor. Furthermore, this invention is applicable to the case of forming the silicon oxide film used as the gate insulating film or the like, in a process for manufacturing a three-dimensional transistor having a particular structure, such as a fin structure or groove gate structure, in which the surface orientation dependent properties on the silicon surface is changed in a certain concavo-convex portion. Besides, this invention can also be applied to formation of a tunnel oxide film as used in the flash memory. It should be noted that poly crystal silicon and/or amorphous silicon may also be used herein, in place of using the single crystal silicon.

In the above embodiment, the method for forming the silicon oxide film used as the insulating film has been discussed. However, the silicon oxide film formed in accordance with the method of this invention may be subject to a nitriding process to form a silicon oxide-nitride film (SiON film). While a method for nitriding process of the silicon oxide film is not critical herein, it is preferred that a suitable plasma nitriding process, using, for example, a mixed gas containing the Ar gas and $N_2$ gas, is employed.

INDUSTRIAL APPLICABILITY

As stated above, the present invention has wide applicability for forming the silicon oxide film or the like, in manufacturing various semiconductor devices.

The invention claimed is:

1. A method for forming a silicon oxide film, comprising:
a first oxidation step for generating plasma of a processing gas, under a first process condition that a ratio of oxygen in the processing gas is 1% or less and pressure is within a range of 0.133 to 133 Pa, in a processing chamber of a plasma processing apparatus, so as to form the silicon oxide film, by oxidizing silicon on a surface of an object to be processed including silicon as a main component, by using the plasma; and
a second oxidation step, performed following the first oxidation step, for generating plasma of processing gas, under a second process condition that the ratio of oxygen in the processing gas is 20% or more and pressure is within a range of 400 to 1333 Pa, so as to form an additional silicon oxide film, by further oxidizing the surface of the object to be processed, by using the plasma, thereby improving quality of the silicon oxide film,
wherein the plasma in the first and second oxidation steps is microwave excitation plasma generated from the processing gas, with a microwave introduced into the processing chamber from a planar antenna having a plurality of slots formed therein.

2. The method for forming the silicon oxide film, according to claim 1, wherein the process time for the second oxidation step is within a range of 1 to 600 seconds.

3. The method for forming the silicon oxide film, according to claim 1, wherein a ratio of film thickness of the silicon oxide film formed in the second oxidation step, relative to the total film thickness of the silicon oxide film and the additional silicon oxide film formed through both of the first and second oxidation steps, is within a range of 0.1 to 5%.

4. The method for forming the silicon oxide film, according to claim 1, wherein the ratio of oxygen in the processing gas in the first oxidation step is within a range of 0.2 to 1%.

5. The method for forming the silicon oxide film, according to claim 1, wherein the ratio of oxygen in the processing gas in the second oxidation step is within a range of 20 to 50%.

6. The method for forming the silicon oxide film, according to claim 1, wherein the processing gas, in the first oxidation step, contains 0.1 to 10% of hydrogen.

7. The method for forming the silicon oxide film, according to claim 1, wherein the processing temperature is within a range of 200 to 800° C. in the first and second oxidation steps.

8. A method for forming a silicon oxide film, comprising:
a first oxidation step for generating plasma of a processing gas, under a first process condition that a ratio of oxygen in the processing gas is 1% or less and pressure is within a range of 0.133 to 133 Pa, in a processing chamber of a plasma processing apparatus, so as to form the silicon oxide film, by oxidizing silicon on a surface of an object to be processed including silicon as a main component, by using the plasma; and a second oxidation step, performed following the first oxidation step, for generating plasma of a processing gas, under a second process condition that the ratio of oxygen in the processing gas is 20% or more and pressure is within a range of 400 to 1333 Pa, so as to form an additional silicon oxide film, by further oxidizing the surface of the object to be processed, by using the plasma, thereby improving quality of the silicon oxide film, wherein a ratio of film thickness of the silicon oxide film formed in the second oxidation step, relative to the total film thickness of the silicon oxide film and the additional silicon oxide film formed through both of the first and second oxidation steps, is within a range of 0.1 to 5%.

9. The method for forming the silicon oxide film, according to claim 8, wherein the process time for the second oxidation step is within a range of 1 to 600 seconds.

10. The method for forming the silicon oxide film, according to claim 8, wherein the ratio of oxygen in the processing gas in the first oxidation step is within a range of 0.2 to 1%.

11. The method for forming the silicon oxide film, according to claim 8, wherein the ratio of oxygen in the processing gas in the second oxidation step is within a range of 20 to 50%.

12. The method for forming the silicon oxide film, according to claim 8, wherein the processing gas, in the first oxidation step, contains 0.1 to 10% of hydrogen.

13. The method for forming the silicon oxide film, according to claim 8, wherein the processing temperature is within a range of 200 to 800° C. in the first and second oxidation steps.

14. The method for forming the silicon oxide film, according to claim 8, wherein the plasma in the first and second oxidation steps is microwave excitation plasma generated from the processing gas, with a microwave introduced into the processing chamber from a planar antenna having a plurality of slots formed therein.

15. The method for forming a silicon oxide film, comprising:

a first oxidation step for generating plasma of a processing gas, under a first process condition that a ratio of oxygen in the processing gas is 1% or less and pressure is within a range of 0.133 to 133 Pa, in a processing chamber of a plasma processing apparatus, so as to form the silicon oxide film, by oxidizing silicon on a surface of an object to be processed including silicon as a main component, by using the plasma; and a second oxidation step, performed following the first oxidation step, for generating plasma of a processing gas, under a second process condition that the ratio of oxygen in the processing gas is 20% or more and pressure is within a range of 400 to 1333 Pa, so as to form an additional silicon oxide film, by further oxidizing the surface of the object to be processed, by using the plasma, thereby improving quality of the silicon oxide film, wherein the processing gas, in the first oxidation step, contains 0.1 to 10% of hydrogen.

16. The method for forming the silicon oxide film, according to claim 15, wherein the process time for the second oxidation step is within a range of 1 to 600 seconds.

17. The method for forming the silicon oxide film, according to claim 15, wherein a ratio of film thickness of the silicon oxide film formed in the second oxidation step, relative to the total film thickness of the silicon oxide film and the additional silicon oxide film formed through both of the first and second oxidation steps, is within a range of 0.1 to 5%.

18. The method for forming the silicon oxide film, according to claim 15, wherein the ratio of oxygen in the processing gas in the first oxidation step is within a range of 0.2 to 1%.

19. The method for forming the silicon oxide film, according to claim 15, wherein the ratio of oxygen in the processing gas in the second oxidation step is within a range of 20 to 50%.

20. The method for forming the silicon oxide film, according to claim 15, wherein the processing temperature is within a range of 200 to 800° C. in the first and second oxidation steps.

21. The method for forming the silicon oxide film, according to claim 15, wherein the plasma in the first and second oxidation steps is microwave excitation plasma generated from the processing gas, with a microwave introduced into the processing chamber from a planar antenna having a plurality of slots formed therein.

* * * * *